United States Patent [19]
Pun

[11] Patent Number: 5,930,735
[45] Date of Patent: Jul. 27, 1999

[54] INTEGRATED CIRCUIT TESTER INCLUDING AT LEAST ONE QUASI-AUTONOMOUS TEST INSTRUMENT

[75] Inventor: Henry Y. Pun, Santa Clara, Calif.

[73] Assignee: Credence Systems Corporation, Fremont, Calif.

[21] Appl. No.: 08/850,750

[22] Filed: Apr. 30, 1997

[51] Int. Cl.⁶ .................................................. G01R 31/26
[52] U.S. Cl. ...................... 702/119; 371/22.1; 371/22.36; 371/22.5; 395/555
[58] Field of Search ........................... 702/119; 371/25.1, 371/22.1, 22.36, 22.6, 22.5, 27.7; 323/285; 395/555–557

[56] References Cited

U.S. PATENT DOCUMENTS

| | | | |
|---|---|---|---|
| 5,059,889 | 10/1991 | Heaton | 323/285 |
| 5,375,075 | 12/1994 | Ogata et al. | 702/119 |
| 5,731,700 | 3/1998 | McDonald | 324/158.1 |
| 5,748,642 | 5/1998 | Lesmeister | 371/22.1 |

*Primary Examiner*—Kamini Shah
*Attorney, Agent, or Firm*—Smith-Hill and Bedell

[57] ABSTRACT

An integrated circuit tester includes a quasi-autonomous test instrument for performing an acquisition task. The test instrument includes a state machine, a command stack for storing commands which specify parameters of the acquisition task, an acquisition device having at least one terminal for connection to a pin of the DUT for acquiring a value of a variable from the DUT in accordance with the defined parameters of the acquisition task, and an acquisition memory for temporarily storing acquired values and making the acquired values available after the test. The state machine is responsive to an externally supplied trigger to initiate performance of the acquisition task under control of a clock signal by reading a command from the command stack and to perform the acquisition task in accordance with the parameters specified in the command.

15 Claims, 3 Drawing Sheets

INTEGRATED CIRCUIT TESTER INCLUDING AT LEAST ONE QUASI-AUTONOMOUS TEST INSTRUMENT

BACKGROUND OF THE INVENTION

This invention relates to an integrated circuit tester including at least one quasi-autonomous test instrument.

An integrated circuit tester is used to predict how an integrated circuit device will behave in operation. A typical integrated circuit tester includes a test head having multiple tester modules, each of which has a signal terminal. Each tester module includes pin electronics circuitry which operates the module selectively in one of several operating modes, which typically include drive high, drive low, compare high and compare low. In the drive high mode, for example, the circuitry applies a logic high signal to the signal terminal, whereas in the compare low mode, the circuitry compares the voltage at the signal terminal with a low threshold value. In order to carry out a test, the test head is positioned with the signal terminals of the tester modules in contact with respective pads of a load board. The load board provides a parallel electrical interface between the signal terminals of the tester modules and the signal pins of the device under test (DUT). The load board may support connections to multiple devices in order to allow multiple devices to be tested concurrently.

The tester includes a device power supply (DPS) having force and return terminals connected through the load board to respective power supply pins of the DUT to supply operating current to the DUT. A test is executed in a succession of cycles, and for each cycle of the test, each tester module is placed in a selected one of its predetermined operating modes. In this manner, the DUT is exercised through a sequence of internal states, and the nature of the output of the DUT in each state is observed. In the case of a complex DUT, there may be many thousands of test cycles and therefore the testing can take a long time.

Two aspects of testing of an integrated circuit device are functional testing and quiescent current testing. The purpose of functional testing is to determine whether the DUT provides the expected output in each state. The purpose of quiescent current testing is to detect anomalies in current consumption by measuring the current drawn by the DUT in steady state, when there are no changes in state occurring.

FIG. 4 illustrates in simplified block form a conventional topology for an integrated circuit tester 10 for testing an integrated circuit device 14. The tester operates under control of a server 16 and includes several current measuring DPSs 18 each having force and return terminals connected to power supply pins of the DUT 14. Each DPS includes a power supply amplifier 22 which provides DC power at a voltage dependent on an analog control signal supplied by a digital-to-analog converter (DAC) 24. The output of the amplifier 22 is connected to the force terminal of the DPS through a current sensing resistor 26 and a differential amplifier 28 provides an output signal which depends on the current flowing through the sensing resistor 26. The analog output signal of the differential amplifier 28 is converted to digital form by an analog-to-digital converter (ADC) 30 which operates under control of a sampling controller 32. The digital output signal of the ADC is supplied to the server over a bus 34.

The tester has multiple tester modules 40 each including pin electronics circuitry 46 connected to a signal pin 42 of the DUT 14. The pin electronics circuitry is able to operate selectively in one of several operating modes. Each tester module 40 also includes a local vector memory 44 for storing a succession of commands, each of which may define one of the operating modes of the pin electronics circuitry 46.

The tester also includes a sequencer 48 having an instruction vector memory 50 associated therewith. In a functional test, the server increments the sequencer through a sequence of test cycles, and in each cycle the sequencer reads an instruction from the instruction vector memory and places a command on the bus 34. The tester modules read the command from the bus and use it to access the local vector memory. The data read from the vector memory is employed to place the tester module in the appropriate operating mode, e.g. drive low or compare high, for that cycle of the test.

In a quiescent current test, the instructions loaded into the vector memory 50 include an instruction to measure the current supplied by one or more DPSs in one or more target states of the device. In order to make a quiescent current measurement, the sequencer 48 sensitizes the DUT to a desired target state by stepping through the sequence of states that are necessary to reach the target state. When the DUT is in the target state, the sequencer issues a trigger to the server 16, and the server initiates the current measurement. The server programs the DPS by supplying commands relating to, for example, the current range to be measured and the number of samples to be used in measuring the current. The differential amplifier 28 and the ADC 30 measure the voltage across the sensing resistor 24 and the ADC places digital data values on the bus 34. The server reads the data values, and when sufficient data values have been read the server provides a ready signal to the sequencer to signify that the current measurement test has been completed. The sequencer then resumes operation.

When there are multiple DPSs, the server programs the several DPSs sequentially. Since the server is a multitasking computer, other server operations may take priority over programming the DPSs, with the result that the programming of the DPSs is not repeatable and it is not possible to predict from one test to another when a given DPS will make its measurement relative to another DPS.

SUMMARY OF THE INVENTION

In accordance with a first aspect of the present invention there is provided an integrated circuit tester for testing an integrated circuit device (DUT) having a plurality of signal pins, said integrated circuit tester including a plurality of tester modules each having a signal terminal for connection to a signal pin of the DUT, a means for providing a clock signal, a quasi-autonomous test instrument for performing an acquisition task, said test instrument including a state machine, a command stack for storing commands which specify parameters of the acquisition task, an acquisition device having at least one terminal for connection to a pin of the DUT for acquiring a value of a variable from the DUT in accordance with the defined parameters of the acquisition task, and an acquisition memory for temporarily storing acquired values and making the acquired values available after the test, and a sequencer means coupled operatively to the tester modules for causing the modules to execute a test and coupled operatively to the quasi-autonomous test instrument for supplying a trigger to the test instrument, and wherein the state machine is responsive to the trigger to initiate performance of the acquisition task by reading a command from the command stack and performing the acquisition task in accordance with the parameters specified in the command under control of the clock signal.

In accordance with a second aspect of the present invention there is provided an integrated circuit tester for testing an integrated circuit device (DUT) having a plurality of signal pins, said integrated circuit tester including a plurality of tester modules each having a signal terminal for connection to a signal pin of the DUT, a means for providing a clock signal, first and second quasi-autonomous test instruments for performing first and second acquisition tasks respectively, each instrument including a state machine, a command stack for storing commands which specify parameters of the acquisition task, an acquisition device having at least one terminal for connection to a pin of the DUT for acquiring a value of a variable from the DUT in accordance with the defined parameters of the acquisition task, and an acquisition memory for temporarily storing acquired values and making the acquired values available after the test, and a sequencer means coupled operatively to the tester modules for causing the modules to execute a test and coupled operatively to the first and second quasi-autonomous test instruments for supplying first and second triggers to the first and second test instruments respectively, and wherein the state machine of the first test instrument is responsive to the first trigger to initiate performance of the first acquisition task by reading a command from the command stack and performing the acquisition task in accordance with the parameters specified in the command under control of the clock signal; and the state machine of the second test instrument is responsive to the second trigger to initiate performance of the second acquisition task by reading a command from the command stack and performing the acquisition task in accordance with the parameters specified in the command under control of the clock signal.

In accordance with a third aspect of the present invention there is provided a method of testing an integrated circuit device (DUT) having a plurality of signal pins, comprising interacting with the DUT through at least one of said signal pins to step the DUT through a sequence of states, upon attaining a preselected state, issuing a trigger, in response to the trigger, initiating performance of an acquisition task under control of a clock signal by reading a command which specifies parameters of the acquisition task from a command stack, performing said acquisition task in accordance with the parameters specified in the command under control of a clock signal and thereby measuring values of a variable relating to the DUT, temporarily storing said values in a local memory, continuing stepping through the sequence of states, and after the sequence is complete, reading the contents of the local memory.

BRIEF DESCRIPTION OF THE DRAWINGS

For a better understanding of the invention, and to show how the same may be carried into effect, reference will now be made, by way of example, to the accompanying drawings, in which.

In the several figures of the drawings, like reference numerals designate corresponding elements.

DETAILED DESCRIPTION

Figure 1:
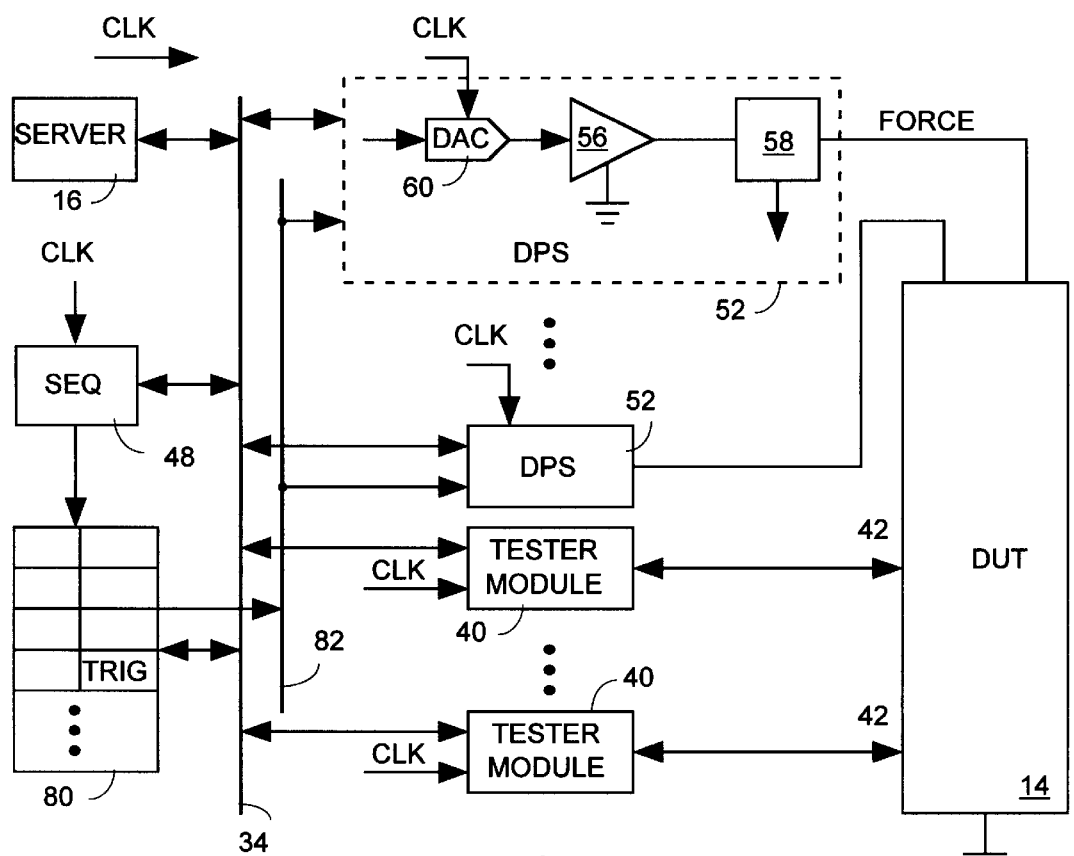
FIG. 1 is a block diagram of an integrated circuit tester in accordance with the present invention.
Figure 2:
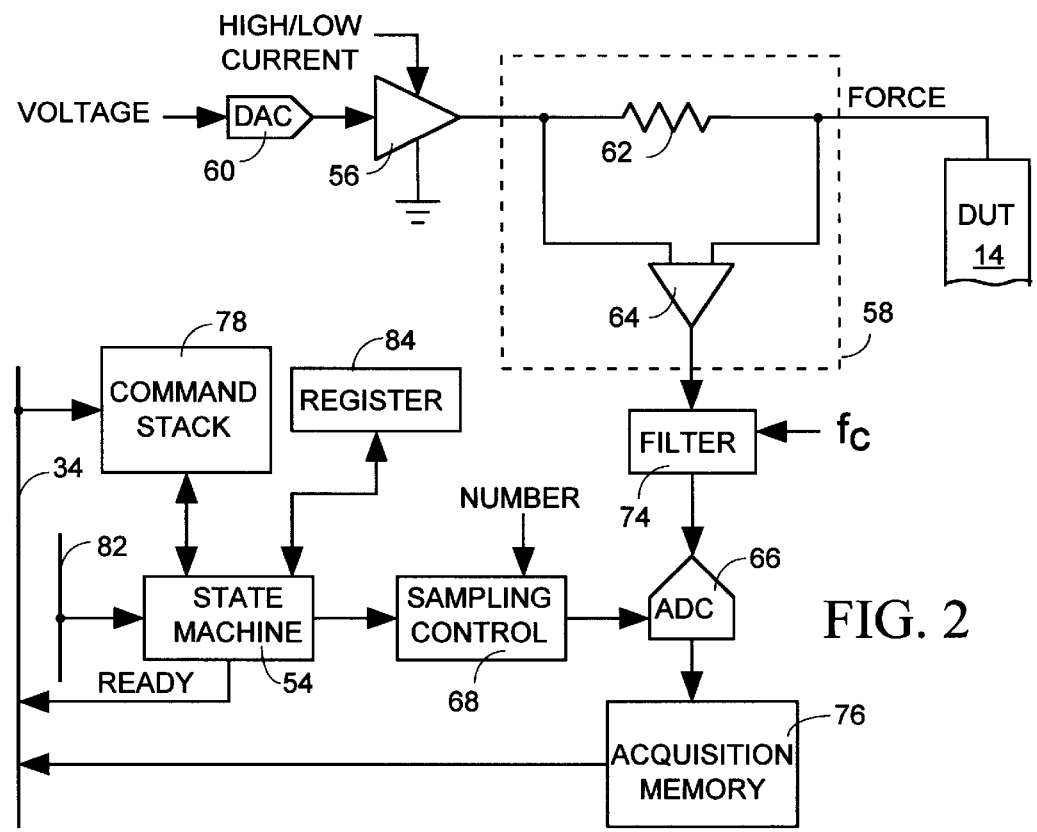
FIG. 2 is a more detailed block diagram of a current measuring device power supply used in the tester shown in FIG. 1.

The tester shown in FIGS. 1 and 2 comprises multiple current measuring device power supplies 52 each of which constitutes a quasi-autonomous test instrument and includes a state machine 54 for controlling operation of the instrument in response to a master clock signal CLK supplied to each DPS. Each DPS 52 includes a power supply amplifier 56 having its output terminal connected through a current measurement device 58 to the force terminal of the DPS. The power supply amplifier supplies a voltage which depends on a digital signal supplied to a DAC 60 by the server 16 and can be operated selectively in a high current mode or a low current mode. The high current mode is used for functional testing of the DUT whereas the low current mode is used for quiescent current measurement, since less current noise is generated in the low current mode.

The current measurement device 58 comprises a current sensing resistor 62 and a differential amplifier 64 which provides an output signal representative of the current drawn by the DUT.

The analog output signal of the amplifier 64 is digitized by an ADC 66, which samples the analog signal in response to sampling pulses provided by a sampling controller 68 and quantizes the samples. The digital output signal of the ADC 66 is loaded into an acquisition memory 76.

Each DPS 52 also includes a command stack 78 which stores, at each address, command values for various parameters associated with operation of the test instrument. These parameters include, for example, start delay and number of samples. The parameters may also include current level and filter time constant.

The vector memory 80 associated with the sequencer 48 stores not only the instructions for supplying to the tester modules 40 over the bus 34 but also triggers which can be supplied to the DPSs 52 over a trigger bus 82 to initiate a quiescent current measurement operation. Each trigger is a 3-bit word which can identify one of up to eight trigger commands. Each state machine can be programmed to respond to any combination of trigger commands. The state machine 54 of each DPS continuously reads the trigger bus and when a state machine detects a trigger command to which it responds, it initiates a sequence of actions under control of the master clock CLK.

On detecting a trigger command to which it responds, the state machine 54 reads an address from an address register 84 and uses this address to read the contents of a memory location in the command stack 78. The contents of the memory location define all the parameters necessary to carry out the desired quiescent current measurement. The state machine supplies the number of samples to the sampling pulse generator 68. The state machine may automatically switch the amplifier 56 to its low current mode for a quiescent current measurement; alternatively, the command read from the command stack may specify the low current mode and be supplied to the amplifier 56. The start delay is supplied to the state machine 52 to control the start time of sampling following receipt of the trigger. In this manner, the DPS is set up for making a current measurement.

The start delay is sufficient to allow the quiescent current to settle and to provide time to set up the DPS for executing the quiescent current measurement. Accordingly, when the specified start delay has elapsed, the DPS is ready to make the current measurement and the state machine 54 supplies a start signal to the sampling controller 68. The sampling controller supplies sampling pulses to the ADC 66 for sampling the analog output signal of differential amplifier. The samples are quantized and the resulting digital values are loaded into the acquisition memory 76.

When the specified number of samples have been taken, the state machine supplies a ready signal to the sequencer 48 and the sequencer resumes its traverse of the vector memory. The state machine also increments the address stored in the register 84, so that on receipt of the next trigger, the state machine reads the next set of commands from the command stack.

At the end of the test, the host computer reads all the data from the acquisition memory 78 and processes the data to provide a test report.

It will be seen from the foregoing that the current measurement device 58 is set up for measurement independently of the relative priority of operations that are to be performed by the server, and consequently the time taken for set up is repeatable. All current measurements are performed repeatably, since the current measurement device operates under control of a master clock and is not dependent on availability of resources of the server. In the event that the trigger defines a group of DPSs, the different DPSs in the group are set up synchronously and operate synchronously and repeatably.

In addition to measuring quiescent current, it may be useful to measure dynamic current, i.e. the current drawn by the DUT when it is being exercised through a sequence of states. The dynamic current will generally be substantially larger than the quiescent current and will generally vary at a substantially higher frequency than the quiescent current. The current measuring DPS shown in FIG. 3 can be used for measuring both quiescent current and dynamic current.

Figure 3:
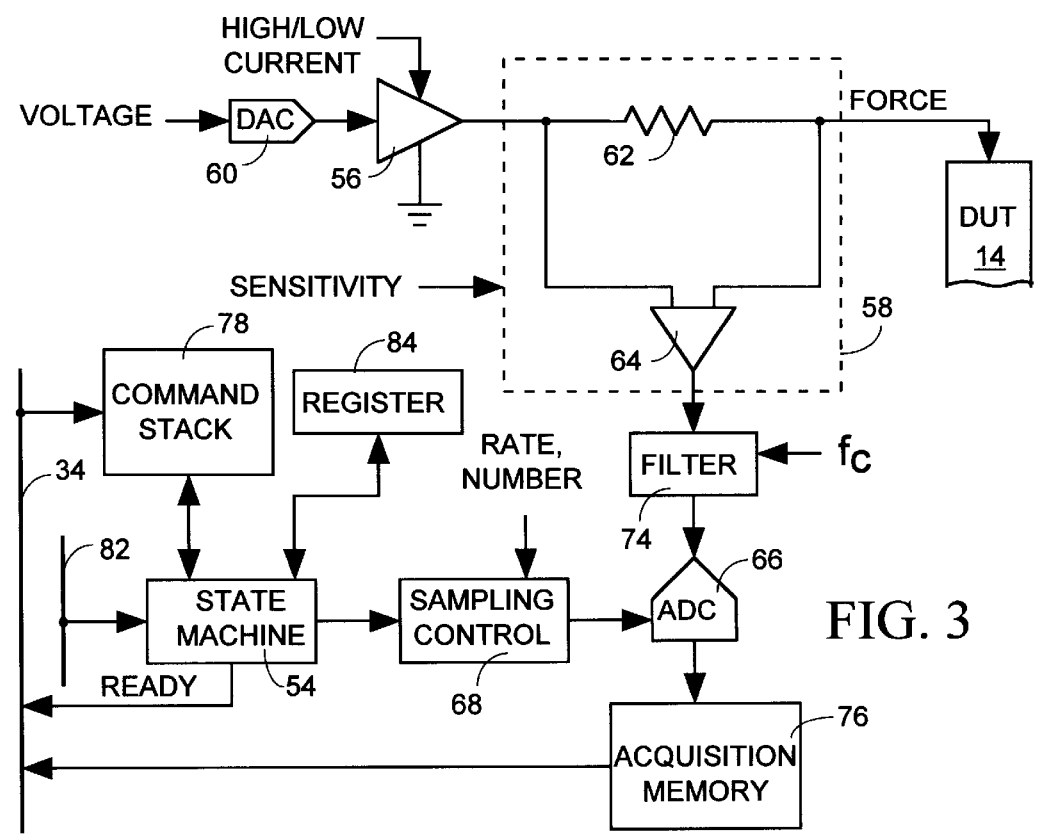
FIG. 3 is a similar view of a modified form of the device power supply shown in FIG. 2.
Figure 4:
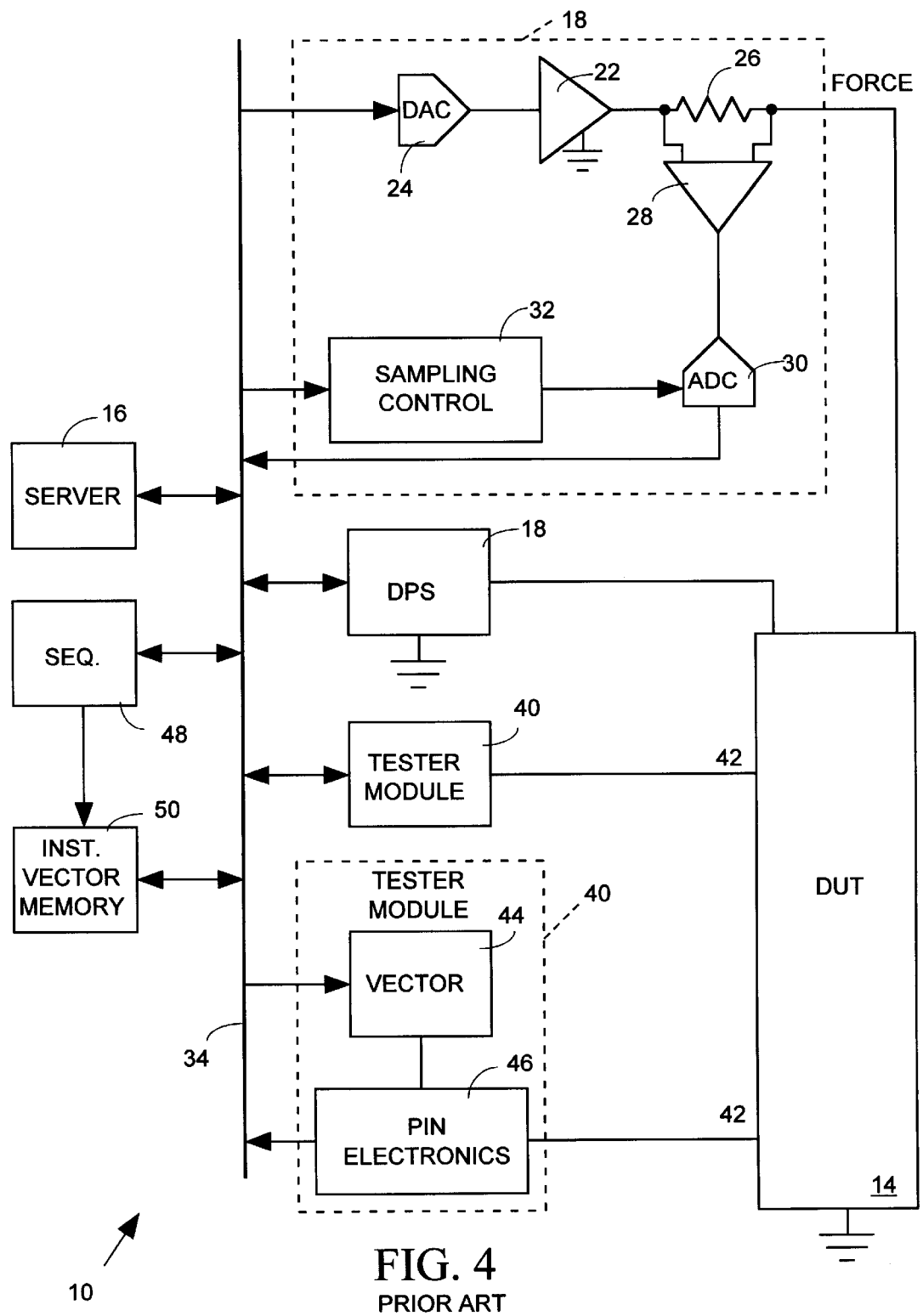
FIG. 4 is a block diagram of an integrated circuit tester in accordance with the prior art.

In the DPS shown in FIG. 3, the sensitivity of the current measurement device 58 is adjustable. This allows a small current to be measured with high accuracy and it also allows a high current to be measured although the accuracy is lower. The high sensitivity setting is normally employed for quiescent current measurements whereas the low sensitivity setting is normally employed for dynamic current measurements. Adjustable sensitivity can be achieved by providing multiple sensing resistors and switches for selecting which resistor will be effective and/or by adjusting the gain of the differential amplifier 64.

Further, because the dynamic current can vary at a high frequency, the rate at which the sampling pulse generator generates sampling pulses is variable. The sampling rate selected for a particular dynamic current measurement depends on the expected frequency of the output signal of the amplifier 64. In order to prevent aliasing due to sampling at a rate below the Nyquist limit, the output signal of the amplifier 64 is supplied to the ADC through a programmable low-pass filter 74 having an adjustable cut-off frequency $f_c$, The cut-off frequency is somewhat less than half the sampling rate. The converted digital samples are averaged to reduce noise and increase measurement accuracy.

In the DPS shown in FIG. 3, the command values stored at each location of the command stack include not only start delay and number of samples but also sensitivity, sampling rate, cut-off frequency and current level. When the state machine reads the contents of a memory location in the command stack, it supplies the sensitivity value to the current measurement device 58, which responds by adjusting its sensitivity to the specified value, and it supplies the cut-off frequency to the filter 74, the sampling rate to the sampling pulse generator and the current level to the power supply amplifier.

In the case of a dynamic current measurement, the sequencer exercises the DUT through a loop of patterns and the trigger is generated either in the loop or before the loop is entered. The start delay is selected to ensure that the current measurement device will be ready to make measurements when the DUT is in the desired state relative to the loop, i.e. in the loop and possibly also just before entering the loop.

When the DUT is exercised through a sequence of patterns, the current drawn by the DUT is generally much higher than the quiescent current, as explained above. In order to supply the necessary high current, the power supply amplifier is switched to its high current mode. Because the current is high, the sensitivity of the current measurement device is set to a lower value than would normally be used in a quiescent current measurement. Further, because of the high frequency of the dynamic current, the filter cut-off frequency is generally much lower for a dynamic current measurement than for a quiescent current measurement. The sampling rate is selected on the basis of the cut-off frequency of the filter 74.

A quiescent current measurement can be performed using the DPS shown in FIG. 3 in essentially the same manner as that described with reference to FIG. 2. The current level is set to the low level, sensitivity is set high, and the sampling rate and cut-off frequency are low.

Other quasi-autonomous test instruments may be used for performing other tests. For example, a digital waveform recorder connected to a signal pin of the DUT for digitizing and storing a signal existing at the pin of the DUT may also be configured as a quasi-autonomous test instrument, in which case the parameters stored in the command stack might include sampling rate, quantization range, number of samples and filter cut-off frequency. In each case, the test instrument includes a state machine which responds to a trigger by reading commands from a command stack, setting up the instrument on the basis of the commands to perform the test, storing the test result temporarily in a local acquisition memory, and supplying a ready signal to the sequencer when the test is complete. Since all the test instruments receive the same master clock signal, they all operate synchronously. Also, the tester modules receive the same master clock signal and operate synchronously.

It will be appreciated that the invention is not restricted to the particular embodiment that has been described, and that variations may be made therein without departing from the scope of the invention as defined in the appended claims and equivalents thereof.

I claim:

1. An integrated circuit tester for testing an integrated circuit device (DUT) having a plurality of signal pins, said integrated circuit tester including:

a plurality of tester modules having respective signal terminals for connection to respective signal pins of the DUT, each tester module having a plurality of operating modes, a means for providing a clock signal, a quasi-autonomous test instrument for performing an acquisition task, said test instrument including a state machine, a command stack for storing commands which specify parameters of the acquisition task, an acquisition device having at least one terminal for connection to a pin of the DUT for acquiring a value of a variable from the DUT in accordance with the defined parameters of the acquisition task, and an acquisition memory for temporarily storing acquired values and making the acquired values available after the test, and a sequencer means coupled operatively to the tester modules for causing the modules to execute a test and coupled operatively to the quasi-autonomous test instrument for supplying a trigger to the test instrument, and wherein the state machine is responsive to the trigger to initiate performance of the acquisition task by reading a command from the command stack and performing the acquisition task in accordance with the parameters specified in the command under control of the clock signal.

2. A tester according to claim 1, wherein said quasi-autonomous test instrument is a current measuring power supply including a power supply amplifier and a current measurement device for measuring current supplied to a power supply pin of the DUT by the power supply amplifier.

3. A tester according to claim 2, wherein the acquisition device includes a current sensing resistor means and a digitizing means for sensing and digitizing voltage drop across the current sensing resistor means.

4. A tester according to claim 3, wherein the digitizing means comprises a differential amplifier and an analog-to-digital converter.

5. A tester according to claim 4, wherein the commands stored by the command stack specify sampling rate of the digitizer.

6. A tester according to claim 4, further comprising a low pass filter connected between the differential amplifier and the analog-to-digital converter, and wherein the commands stored by the command stack specify cutoff frequency of the low pass filter.

7. A tester according to claim 2, wherein the commands stored by the command stack specify sensitivity of the current measurement device.

8. A tester according to claim 1, wherein the commands stored by the command stack specify a start delay and the state machine is responsive to the start delay to delay acquisition of values until the start delay has elapsed.

9. An integrated circuit tester for testing an integrated circuit device (DUT) having a plurality of signal pins, said integrated circuit tester including:

a plurality of tester modules each having a signal terminal for connection to a signal pin of the DUT, a means for providing a clock signal, a first quasi-autonomous test instrument for performing a first acquisition task, said first test instrument including a state machine, a command stack for storing commands which specify parameters of the first acquisition task, an acquisition device having at least one terminal for connection to a first pin of the DUT for acquiring a value of a variable from the DUT in accordance with the defined parameters of the first acquisition task, and an acquisition memory for temporarily storing acquired values and making the acquired values available after the test, a second quasi-autonomous test instrument for performing a second acquisition task, said second test instrument including a state machine, a command stack for storing commands which specify parameters of the second acquisition task, an acquisition device having at least one terminal for connection to a second pin of the DUT for acquiring a value of a variable from the DUT in accordance with the defined parameters of the second acquisition task, and an acquisition memory for temporarily storing acquired values and making the acquired values available after the test, a sequencer means coupled operatively to the tester modules for causing the modules to execute a test and coupled operatively to the first and second test instruments for supplying triggers to the first and second test instruments, and wherein the state machine of the first test instrument is responsive to a trigger received by the first test instrument to initiate performance of the first acquisition task by reading a command from the command stack of the first test instrument and performing the first acquisition task in accordance with the parameters specified in the command under control of the clock signal and the state machine of the second test instrument is responsive to a trigger received by the second test instrument to initiate performance of the second acquisition task by reading a command from the command stack of the second test instrument and performing the second acquisition task in accordance with the parameters specified in the command under control of the clock signal.

10. A tester according to claim 1, comprising a plurality of quasi-autonomous test instruments for performing respective acquisition tasks and each including a state machine, a command stack, an acquisition device and an acquisition memory, and wherein each instrument is responsive to a common master clock, whereby the instruments operate synchronously.

11. An integrated circuit tester for testing an integrated circuit device (DUT) having a plurality of signal pins, said integrated circuit tester including:

a plurality of tester modules each having a signal terminal for connection to a signal pin of the DUT, a means for providing a clock signal, first and second quasi-autonomous test instruments for performing first and second acquisition tasks respectively, each instrument including a state machine, a command stack for storing commands which specify parameters of the acquisition task, an acquisition device having at least one terminal for connection to a pin of the DUT for acquiring a value of a variable from the DUT in accordance with the defined parameters of the acquisition task, and an acquisition memory for temporarily storing acquired values and making the acquired values available after the test, and a sequencer means coupled operatively to the tester modules for causing the modules to execute a test and coupled operatively to the first and second quasi-autonomous test instruments for supplying first and second triggers to the first and second test instruments respectively, and wherein the state machine of the first test instrument is responsive to the first trigger to initiate performance of the first acquisition task by reading a command from the command stack and performing the acquisition task in accordance with the parameters specified in the command under control of the clock signal; and the state machine of the second test instrument is responsive to the second trigger to initiate performance of the second acquisition task by reading a command from the command stack and performing the acquisition task in accordance with the parameters specified in the command under control of the clock signal.

12. A tester according to claim 11, wherein the first and second test instruments are separately responsive to the first and second triggers respectively and both are responsive to a third trigger.

13. A method of testing an integrated circuit device (DUT) having a plurality of signal pins, comprising:

interacting with the DUT through at least one of said signal pins to step the DUT through a sequence of states, upon attaining a preselected state, issuing a trigger, in response to the trigger, initiating performance of an acquisition task under control of a clock signal by reading a command which specifies parameters of the acquisition task from a command stack, performing said acquisition task in accordance with the parameters specified in the command under control of a clock signal and thereby measuring values of a variable relating to the DUT, temporarily storing said values in a local memory, continuing stepping through the sequence of states, and after the sequence is complete, reading the contents of the local memory.

14. A method according to claim 13, wherein the acquisition task is measuring quiescent current of the DUT.

15. A method according to claim 13, wherein the acquisition task is measuring dynamic current of the DUT.

* * * * *